(12) United States Patent
Wiklund et al.

(10) Patent No.: US 9,806,880 B1
(45) Date of Patent: Oct. 31, 2017

(54) DYNAMIC ADJUSTMENT OF A RESPONSE CHARACTERISTIC OF A PHASE-LOCKED LOOP DIGITAL FILTER

(71) Applicant: QUALCOMM Incorporated, San Diego, CA (US)

(72) Inventors: Magnus Olov Wiklund, San Jose, CA (US); Emanuele Lopelli, Laguna Niguel, CA (US); Charles Wang, Irvine, CA (US); Mahbod Mofidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/183,314

(22) Filed: Jun. 15, 2016

(51) Int. Cl.
*H04L 7/033* (2006.01)
*H04L 7/00* (2006.01)
*H03L 7/091* (2006.01)

(52) U.S. Cl.
CPC ............ *H04L 7/0331* (2013.01); *H03L 7/091* (2013.01); *H04L 7/0087* (2013.01); *H04L 7/0091* (2013.01); *H03L 2207/50* (2013.01)

(58) Field of Classification Search
CPC ..... H04L 7/0331; H04L 7/091; H04L 7/0087; H04L 7/0091
USPC ........................................................ 375/355
See application file for complete search history.

(56) References Cited

U.S. PATENT DOCUMENTS

| 7,786,913 | B2 | 8/2010 | Waheed et al. |
| 7,787,581 | B2 | 8/2010 | Landmark |
| 7,907,016 | B2 | 3/2011 | Eikenbroek |
| 8,971,455 | B2 | 3/2015 | Ganesan et al. |
| 2009/0268859 | A1* | 10/2009 | Sun ........................... H03L 7/00 375/376 |
| 2013/0181770 | A1 | 7/2013 | Sasaki |
| 2013/0328604 | A1* | 12/2013 | Matsuda ................. H03L 7/107 327/159 |

* cited by examiner

*Primary Examiner* — Michael Neff
(74) *Attorney, Agent, or Firm* — Muncy, Geissler, Olds & Lowe, P.C./QUALCOMM

(57) ABSTRACT

An example phase-locked loop (PLL) includes a digital filter, an oscillator, and a time-to-digital converter (TDC). The digital filter is configured to sample at a discrete time that is responsive to a reference clock signal received at the digital filter. The oscillator is coupled to the digital filter and configured to generate an output signal of the PLL. The TDC is coupled to the oscillator to determine a phase difference between the output signal and the reference clock signal. The TDC also provides a time signal to the digital filter that is based on the phase difference and is representative of an instantaneous rate of operation of the PLL. The digital filter is further configured to adjust a response characteristic of the digital filter according to the time signal.

26 Claims, 10 Drawing Sheets

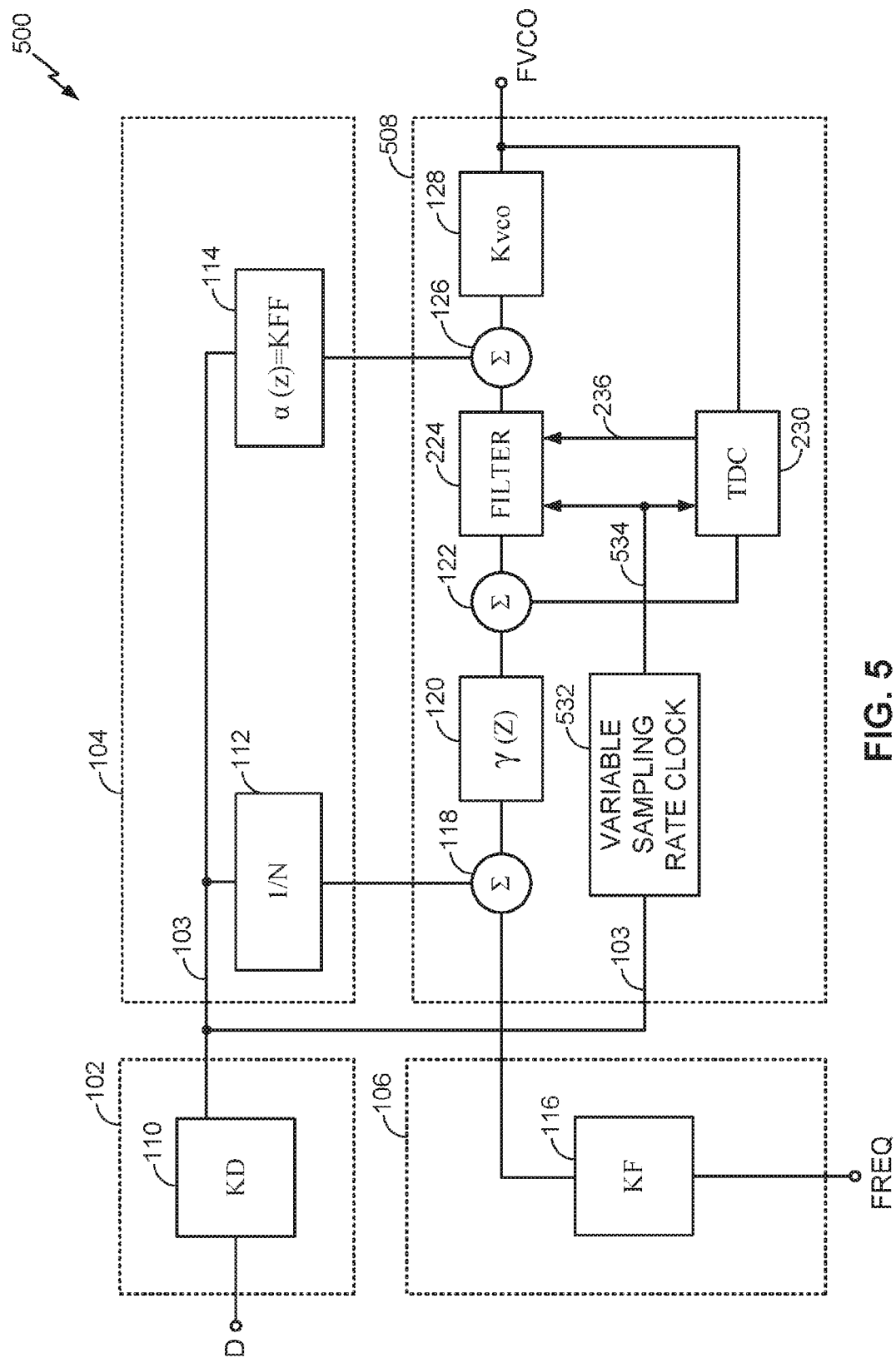

DYNAMIC ADJUSTMENT OF A RESPONSE CHARACTERISTIC OF A PHASE-LOCKED LOOP DIGITAL FILTER

FIELD OF DISCLOSURE

This disclosure relates generally to electronic circuits, and in particular, but not exclusively to the adjustment of a response characteristic of a Phase-Locked Loop (PLL) digital filter.

BACKGROUND

Phase-locked loops are used in many applications, including use in local oscillators of wireless transceivers (i.e., receivers and/or transmitters). In certain applications, such phase-locked loops are implemented with analog circuitry. However, as the operating speeds of digital circuits increase, it is becoming more feasible to implement at least portions of a phase-locked loop for traditionally analog applications using digital building blocks. These phase-locked loops are often referred to as All-Digital Phase Locked Loops (AD-PLLs).

In operation an ADPLL may be configured to receive a frequency signal (e.g., FREQ) that is representative of a desired output frequency of the ADPLL. When the ADPLL is locked, the phase, frequency, or both, of an output the ADPLL is locked relative to the frequency signal. In certain wireless transceivers, the frequency signal may be generated by a baseband processor, or the like.

In some applications, the ADPLL may include a digital filter within a feedforward path of the ADPLL. In certain designs the digital filter samples the feedforward path at a fixed sampling rate FREF. However, the fixed sampling rate FREF may not be aligned with the output of the ADPLL. For example, an ADPLL is inherently event driven which includes the detection of zero-crossing at the output of the ADPLL. These zero-crossings vary in time, which results in a non-uniformly sampled system. That is, with the sampling rate FREF out of alignment with the output of the ADPLL, jitter may result. This jitter may directly generate undesirable spurs in the output of the ADPLL.

SUMMARY

The following presents a simplified summary relating to one or more aspects and/or embodiments associated with the mechanisms disclosed herein for the dynamic adjustment of a response characteristic of phase-locked loop (PLL) digital filter. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary presents certain concepts relating to one or more aspects and/or embodiments relating to the mechanisms disclosed herein to adjust a response characteristic of a PLL digital filter in a simplified form to precede the detailed description presented below.

According to one aspect, an example phase-locked loop (PLL) includes a digital filter, an oscillator, and a time-to-digital converter (TDC). The digital filter is configured to sample at a discrete time that is responsive to a reference clock signal received at the digital filter. The oscillator is coupled to the digital filter and configured to generate an output signal of the PLL. The TDC is coupled to the oscillator to determine a phase difference between the output signal and the reference clock signal. The TDC also provides a time signal to the digital filter that is based on the phase difference and is representative of an instantaneous rate of operation of the PLL. The digital filter is further configured to adjust a response characteristic of the digital filter according to the time signal.

According to another aspect, a method for use with a phase-locked loop (PLL) includes sampling, by a digital filter of the PLL, at a discrete time in response to a reference clock signal received at the digital filter. The method also includes generating, by an oscillator of the PLL, an output signal of the PLL in response to an output of the digital filter. Next, a TDC of the PLL determines a phase difference between the output signal of the PLL and the reference clock signal. The method further includes providing, by the TDC, a time signal to the digital filter, where the time signal is based on the phase difference and is representative of an instantaneous rate of operation of the PLL. The digital filter then adjusts a response characteristic of the digital filter according to the time signal.

According to yet another aspect, a phase-locked loop (PLL) includes: (i) means for filtering in a feedforward path of the PLL, where the means for filtering includes means for sampling at a discrete time in response to a reference clock signal, (ii) means for generating an output signal of the PLL in response to an output of the means for sampling, (iii) means for determining a phase difference between the output signal of the PLL and the reference clock signal, (iv) means for providing a time signal to the means for sampling, where the time signal is based on the phase difference and is representative of an instantaneous rate of operation of the PLL, and (v) means for adjusting a response characteristic of the means for sampling according to the time signal.

According to still another aspect, a non-transitory computer-readable medium includes program code stored thereon for use with a phase-locked loop (PLL) that includes a digital filter, an oscillator, and a time-to-digital converter (TDC). The program code includes instructions to direct the PLL to: (i) sample, with the digital filter, at a discrete time in response to a reference clock signal, (ii) generate, with the oscillator, an output signal of the PLL in response to an output of the digital filter, (iii) determine, with the TDC, a phase difference between the output signal of the PLL and the reference clock signal, (iv) provide, by the TDC, a time signal to the digital filter, where the time signal is based on the phase difference and is representative of an instantaneous rate of operation of the PLL, and (v) adjust, by the digital filter, a response characteristic of the digital filter according to the time signal.

BRIEF DESCRIPTION OF THE DRAWINGS

The accompanying drawings are presented to aid in the description of embodiments of the invention and are provided solely for illustration of the embodiments and not limitation thereof.

FIG. 5 illustrates an example apparatus including a PLL with a variable sampling rate clock, according to aspects of the disclosure.

DETAILED DESCRIPTION

Various aspects are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of non-transitory computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter.

Figure 1:
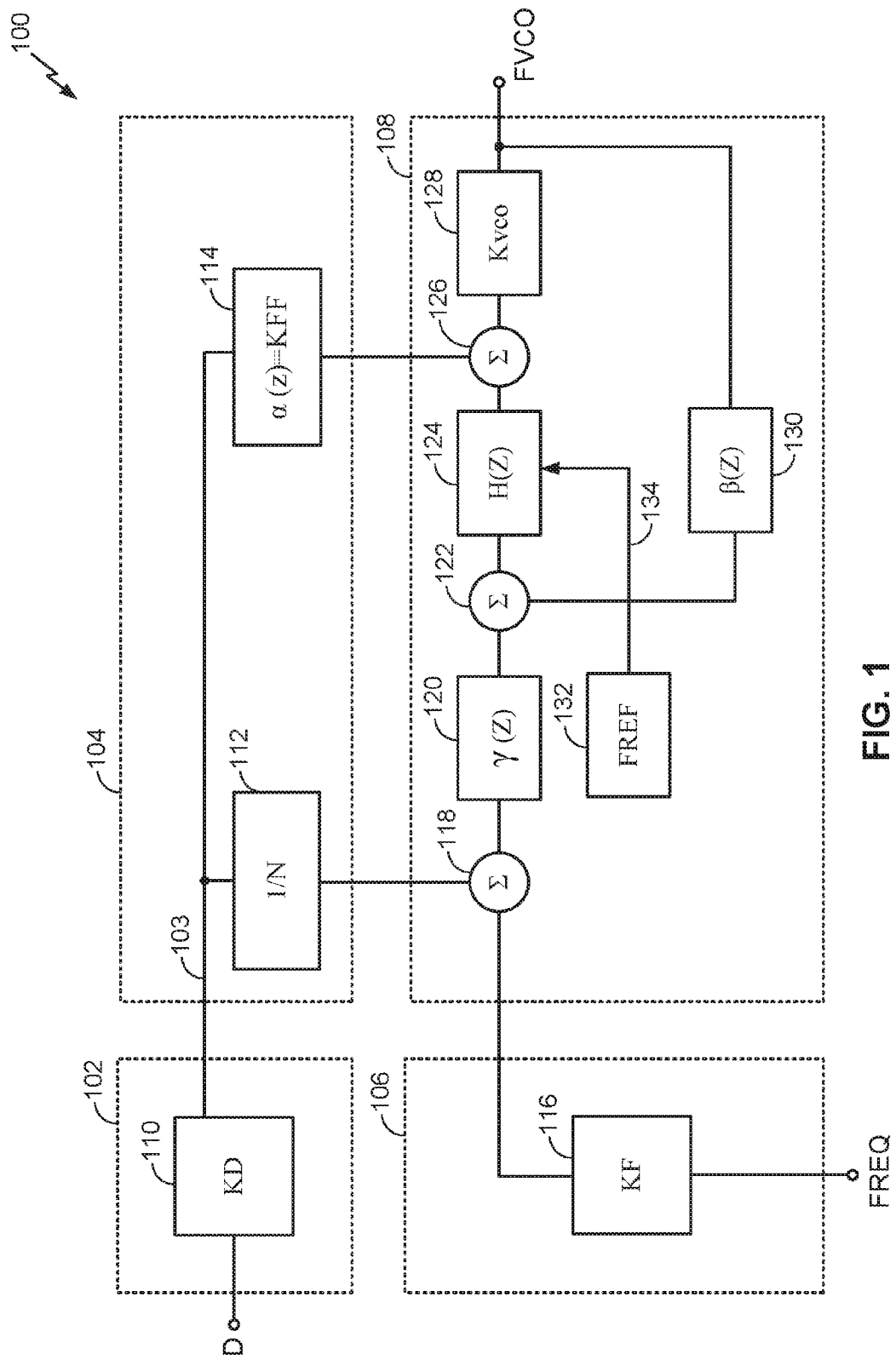
FIG. 1 illustrates an example of conventional direct modulation of an All-Digital Phase Locked Loop (ADPLL).

FIG. 1 illustrates an example of conventional direct modulation of an All-Digital Phase Locked Loop (ADPLL) 108. The apparatus 100, of FIG. 1, is illustrated as including a digital scaling block 102, a modulator 104, a frequency scaling block 106, and ADPLL 108. A feedforward path of the ADPLL 108 includes a digital filter 124 that outputs a stream of digital tuning words. An oscillator 128 receives the digital tuning words and outputs a corresponding signal FVCO whose frequency is determined by the digital tuning word. A feedback path of ADPLL 108 includes a block 130, which may include a Time-to-Digital Converter (TDC) or a phase-to-digital converter (PDC). Block 130 receives the FVCO signal and outputs a fractional part of a phase error word. The phase error word is indicative of a phase error between the FREQ signal (scaled by scaling factor KF 116) and the FVCO signal. The FREQ signal is representative of a desired output frequency of the FVCO signal at the output of the ADPLL 108. In one example, the FREQ signal is generated by a baseband processor (not shown in FIG. 1). An accumulator 118 outputs an integer portion of the phase error word. An accumulator 122 sums corresponding integer portions and fractional portions to output a stream of digital phase error words. The stream of digital phase error words is supplied to digital filter 124. When the loop is locked, the frequency and/or phase of FVCO is locked to the corresponding frequency and/or phase of the FREQ signal.

Also illustrated in FIG. 1, is the modulation of digital data D onto the FVCO signal by way of modulator 104. Digital scaling block 102 receives the digital data D and applies a digital scaling factor KD to the digital data to generate a modulation input signal 103. The modulation input signal 103 is representative of an amount to deviate an output frequency of the FVCO signal. As shown in FIG. 1, modulator 104 is coupled to apply the modulation input signal 103 at two points within ADPLL 108. First, N-divider 112 divides the modulation input signal 103 and applies the divided input signal to accumulator 118. Second, feedforward modulation filter 114 applies a step response calibration factor KFF to accumulator 126 to adjust a feedforward gain of the feedforward path of ADPLL 108.

Further illustrated in FIG. 1 is a reference clock 132 that is configured to generate a reference clock signal 134. The reference clock signal 134 is received by one or more components of the ADPLL 108 and may be used as a common timing reference within the ADPLL 108. By way of example, the reference clock signal 134 may be received by the digital filter 124, where a sampling rate of the digital filter 124 is determined by a frequency of the reference clock signal 134. Thus, in some implementations, reference clock signal 134 may be referred to as a sampling rate clock signal.

As mentioned above, in certain conventional designs, the reference clock signal 134 is constant and fixed. Thus, digital filter 124 is configured to assume a constant sampling rate and samples the feedforward path at a fixed sampling rate determined by the reference clock signal 134. However, this fixed sampling rate is not necessarily aligned with the output (i.e., FVCO) of the ADPLL 108. For example, block 130 (e.g., a TDC) may be configured to detect zero-crossings at the output of the ADPLL 108, but these zero-crossings vary in time, which results in a non-uniformly sampled system. That is, with the sampling rate of the digital filter 124 out of alignment with the output of the ADPLL 108, jitter may result. This jitter may directly generate undesirable spurs in the output of the ADPLL 108.

Accordingly, aspects of the present disclosure provide a method and apparatus for dynamic adjustment of a response characteristic of a PLL digital filter. As will be discussed in more detail below, in some examples, the dynamic adjustment of a response characteristic of the PLL digital filter may align the sampling time of the digital filter at each time step to account for variations at the output of the PLL. Thus, in certain aspects of the present disclosure, a time-to-digital converter (TDC) is configured to generate a time signal that is representative of an instantaneous rate of operation of the PLL. The TDC then provides this time signal to a digital filter that is configured to utilize the time signal as a time variant parameter to dynamically adjust a response characteristic of the digital filter (e.g., sampling rate) at each time step.

Figure 2:
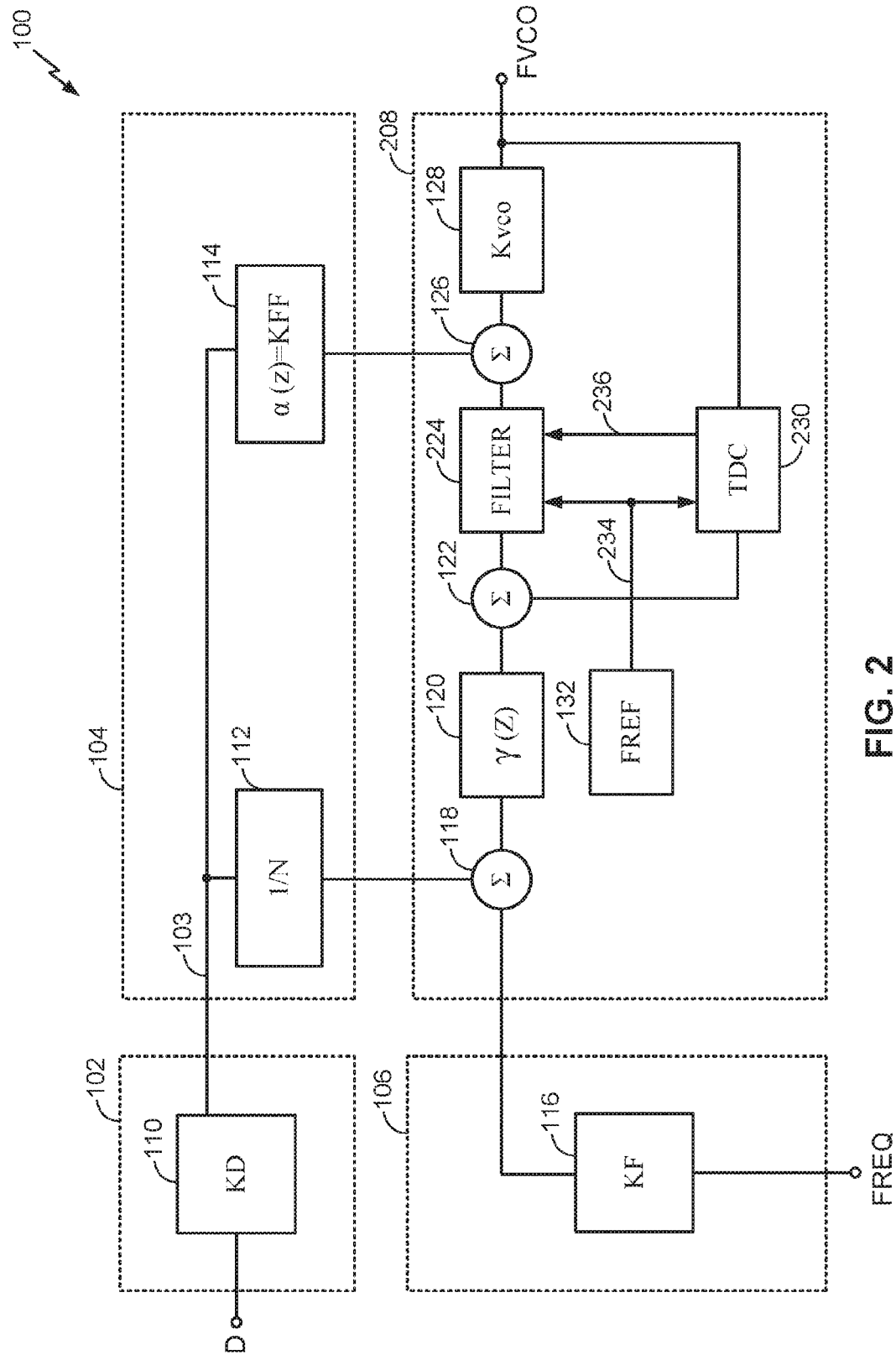
FIG. 2 illustrates an example phase-locked loop (PLL) with dynamic adjustment of a response characteristic of a PLL digital filter, according to aspects of the disclosure.

FIG. 2 illustrates an example phase-locked loop (PLL) 208 with dynamic adjustment of a response characteristic of a digital filter 224, according to aspects of the disclosure. Although FIG. 2 illustrates PLL 208 incorporated into an apparatus 200 including digital scaling block 102, modulator 104, and frequency scaling block 106, embodiments of PLL 208 are not limited to such. That is PLL 208 may be implemented with or without modulation by way of modulator 104 and/or with or without digital scaling block 102 and frequency scaling block 106.

In one example, PLL 208 is an all-digital phase-locked loop (ADPLL). Thus, one or more components of PLL 208, including digital filter 224 and/or TDC 230, may be implemented in hardware (e.g., application specific integrated circuit (ASIC), programmable gate array (PGA), discrete digital circuits, etc.) or in a combination of hardware and software (e.g., a software module executed by a corresponding processor).

Time-to-digital converter (TDC) 230 is coupled to receive the output of the PLL 208 (i.e., FVCO) and to provide a stream of digital tuning words to the accumulator 122. The digital tuning words are the fractional part of a phase error word utilized by digital filter 224, where the phase error word is indicative of a phase error between the FREQ signal (i.e., desired frequency at the output of PLL 208) and the actual frequency at the output of the PLL 208. As shown, TDC 230 is also coupled to receive a reference clock signal 234. As will be discussed below, the reference clock signal 234 is utilized by digital filter 224 to control, in part, the sampling time by digital filter 224.

The TDC 230 is further configured to determine a phase difference between the output signal (i.e., FVCO) and the reference clock signal 234, and to generate a time signal 236 is response thereto. The time signal 236 is representative of an instantaneous rate of operation of the PLL 208. Thus, in one example, the time signal 236 is time variant and tracks changes in the output of PLL 208 with each time step. In one example, the time step is equal to 1/FREF. As further shown in FIG. 2, the TDC 230 is coupled to provide the time signal 236 to the digital filter 224.

Figure 3:
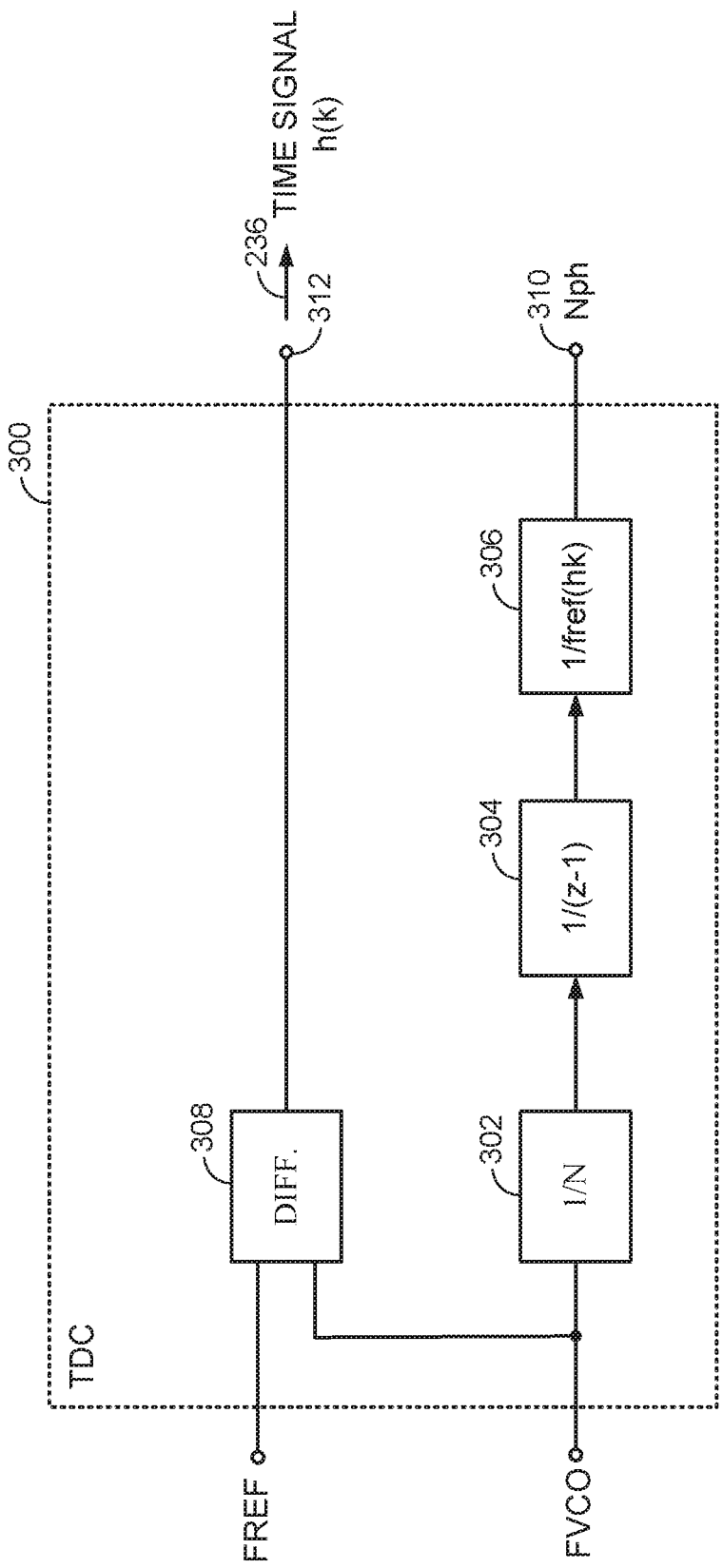
FIG. 3 illustrates an example time-to-digital converter (TDC), according to aspects of the disclosure.

FIG. 3 illustrates an example time-to-digital converter (TDC) 300, according to aspects of the disclosure. TDC 300 is one possible implementation of TDC 230 of FIG. 2. TDC 300 includes a divider 302, an integrator 304, a block 306, and a differentiator 308. TDC 300 is also shown as including outputs 310 and 312. Divider 302 is coupled to receive the output of the PLL (i.e., FVCO). Integrator 304 is coupled between divider and block 306. An output of block 306 is provided as output 310 of the TDC 300. In one example, block 306 implements signal scaling (e.g., 1/fref(hk)). The output 310 of TDC 300 may be coupled to the accumulator 122 of FIG. 2. Divider 302, integrator 304, and block 306, combined, are configured to generate and provide the aforementioned digital tuning words to the output 310 in response to the FVCO signal.

Also included in FIG. 3 is differentiator 308. Differentiator 308 is one possible circuit implementation for generating the time signal 236 at the output 312 of TDC 300. In operation, differentiator 308 determines a phase difference between the output signal (i.e., FVCO) of the PLL 208 and the reference clock signal 234 (i.e., FREF) and to generate the time signal 236 is response thereto. As mentioned above, the time signal 236 is representative of an instantaneous rate of operation of the PLL 208.

In another example, differentiator 308 may be configured to determine a difference between a frequency of the output signal of the PLL 208 and the frequency of the reference clock signal 234, where the time signal 236 is generated by the TDC 300 in response to this frequency difference.

Returning now to FIG. 2, TDC 230 is coupled to provide the time signal 236 to the digital filter 224, where digital filter 224 is configured to adjust a response characteristic of the digital filter 224 according to the time signal 236. In one aspect, the digital filter 224 adjusts its response characteristic to reduce one or more spurs in the output signal of the PLL 208. By way of example, the response characteristic adjusted by the digital filter 224 may be a sampling rate of the digital filter 224. Thus, in this example, digital filter 224 is configured to sample the feedforward path (e.g., the output of accumulator 122) at a discrete time that is based on both the reference clock signal 234 and the time signal 236. The adjustment of the sampling rate of the digital filter 224 may be done, such that the sampling time of the digital filter 224 is aligned with one or more zero-crossings at the output of the PLL 208.

Figure 4A:
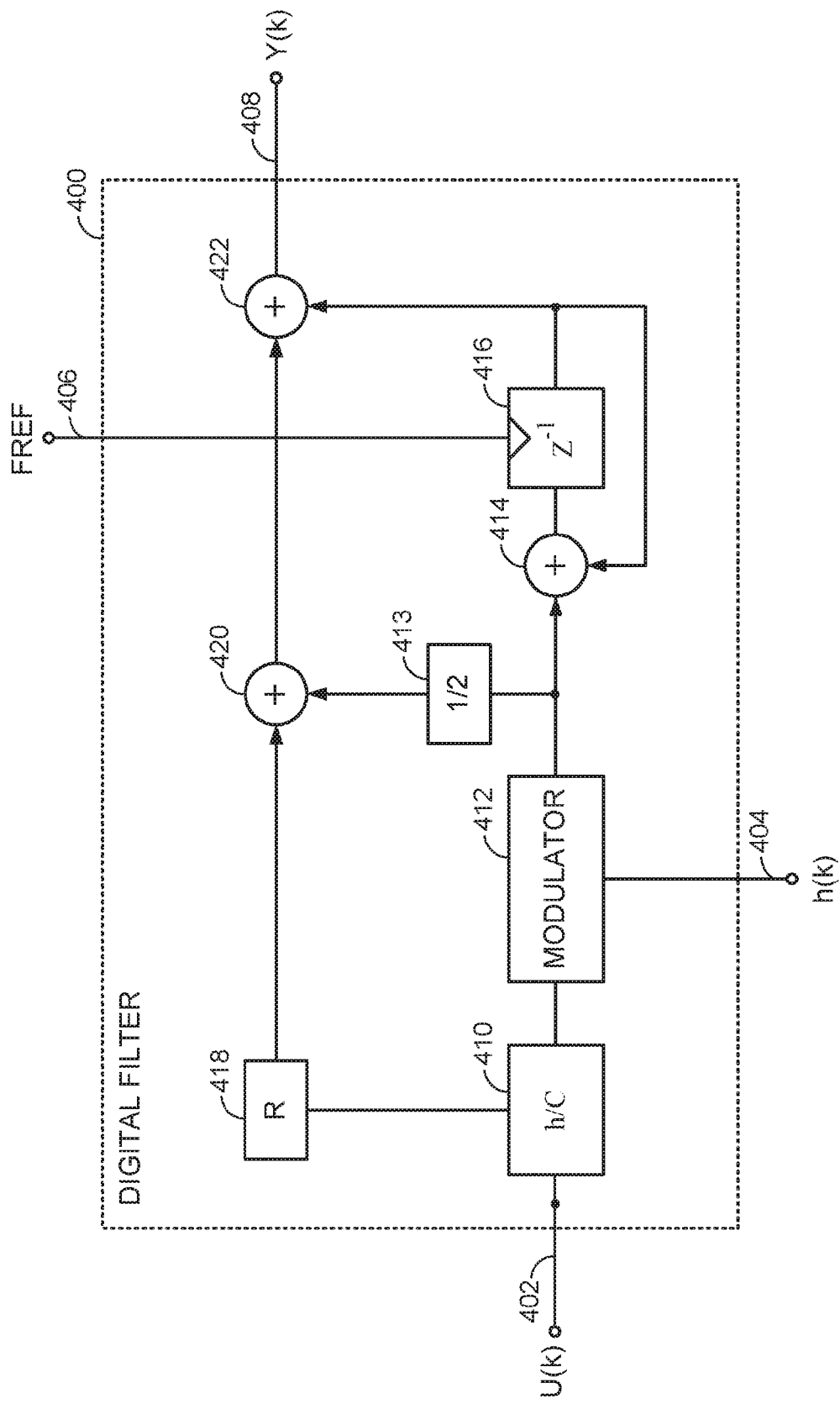
FIG. 4A illustrates an example discrete-time, state-space digital filter, according to aspects of the disclosure.

In one aspect, the aforementioned digital filter is implemented as a discrete-time, state-space filter. By way of example, FIG. 4A illustrates an example discrete-time, state-space digital filter 400, according to aspects of the disclosure. As will be appreciated, a non-state-space filter assumes a fixed time step for sampling. However, if the time step changes over time, how the output of the filter is computed as well as the state of the filter becomes relevant. Since systems, such as PLL 208, are time variant, it may not be possible to arbitrarily transform a non-state-space filter structure into various forms, as is possible for LTI (Linear Time Invariant) systems. That is, it may not be possible for a non-state-space filter to accept time signal 236, as discussed above, as this parameter changes over time. Accordingly, a discrete-time, state-space filter, such as digital filter 400 may be utilized to allow a history of the time signal 236 to be properly captured by the digital filter 400.

Digital filter 400 is one possible implementation of digital filter 224 of FIG. 2. The illustrated example of digital filter 400 is shown as including inputs 402, 404, and 406, and an output 408. Digital filter 400 is also shown as including a filter coefficient block 410, a modulator 412, a divider 413, a summer 414, transfer function block 416, R block 418, a summer 420, and a summer 422. In one example, R block 418 represents a filter parameter (originating from [R]esistance of an analog filter).

Filter coefficient block 410 is coupled to receive the phase error word from accumulator 122 via input 402. As mentioned above, the phase error word is indicative of a phase error between the FREQ signal (i.e., desired frequency at the output of PLL 108) and the actual frequency at the output of the PLL 208. Modulator 412 is coupled to the output of filter coefficient block 410 and is configured to modulate the filter coefficient in response to the time signal 404. In one example, a change in the sample time of the digital filter will be reflected as a change in the time signal 404, such that the filter coefficient block 410 (e.g., h/C) is scaled appropriately by the modulator 412.

Figure 4B:
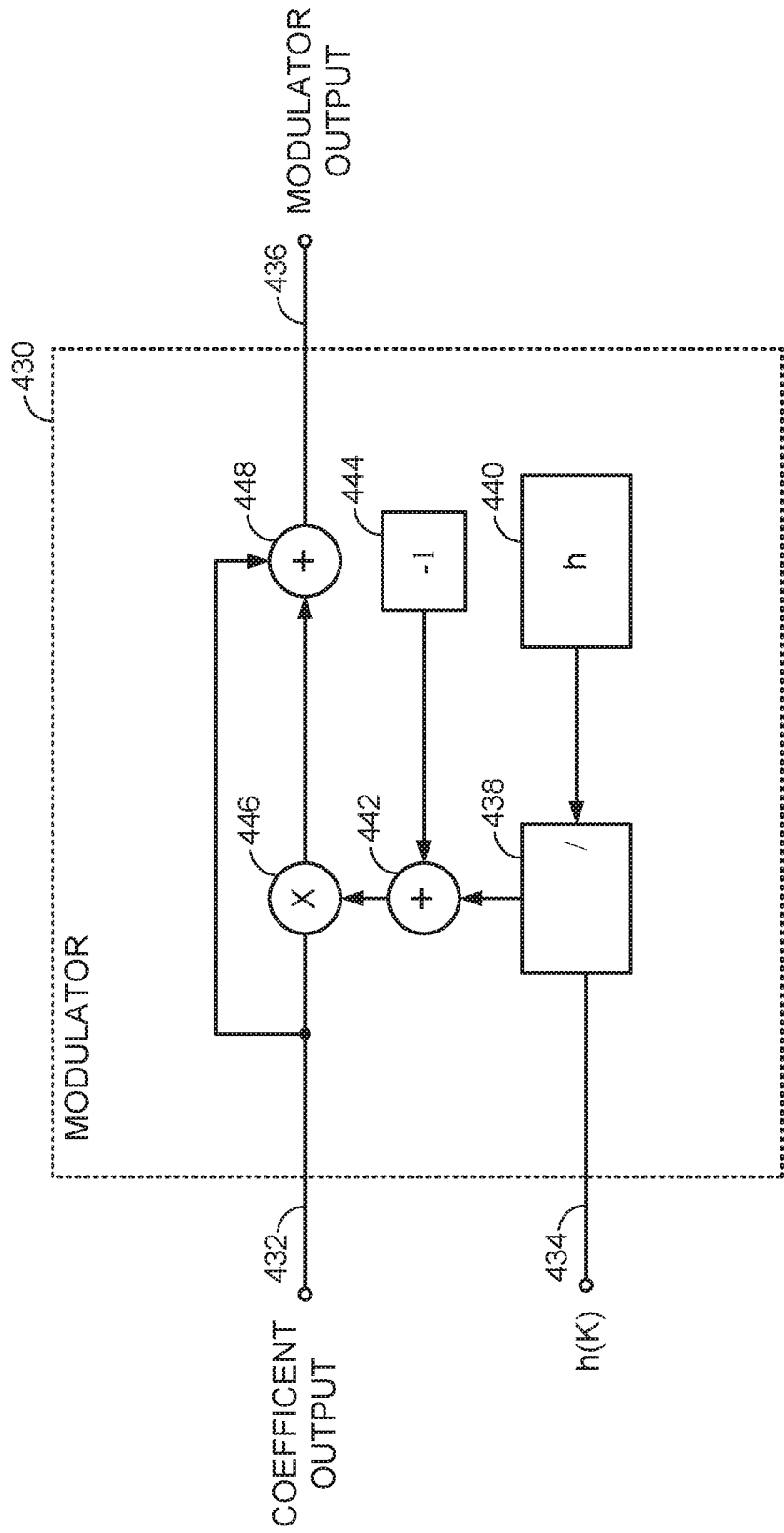
FIG. 4B illustrates an example modulator for use in a digital filter, according to aspects of the disclosure.

FIG. 4B illustrates an example modulator 430 for use in a digital filter, according to aspects of the disclosure. Modulator 430 is one possible implementation of modulator 412 of FIG. 4A. In one aspect, modulator 430 is implemented as a time step modulator that is configured to adjust the output of filter coefficient block 410 in response to the time signal 432 with each time step of the PLL 208. The illustrated example of modulator 430 is shown as including inputs 432 and 434, and a modulator output 436. The input 432 is to be coupled to the output of filter coefficient block 410 of FIG. 4A, while input 432 is coupled to receive the time signal 236 via input 404 of digital filter 400. In one aspect, the operation of modulator 430 is a multiplication operation with h(k)/h, but instead of a multiplicative gain modulator 430 may implement the operation as 1+(h(k)/h−1), which is equal to h(k)/h. For example, when h(k)/h is close to 1, then the additive term (h(k)/h−1) is relatively small.

In one aspect, block 438 represents the h(k)/h division operation, whereas block 440 is the divisor and h(k) is the input signal 432. As shown in FIG. 4B, block 442 together with the −1 from block 440 represents the subtraction with −1 in the expression (h(k)/h−1). Thus, the modulator output 436 is (the coefficient output 434)+(the coefficient output 434 multiplied by the output of block 442).

FIG. 5 illustrates an example apparatus 500 including a PLL 508 with a variable sampling rate clock 532, according to aspects of the disclosure. PLL 508 is similar to PLL 208 of FIG. 2, except that PLL 508 is implemented with a variable sampling rate clock 532 in lieu of, or in addition to, the reference clock 132. As mentioned above, aspects of the disclosed PLLs may be incorporated into an apparatus that includes the direct modulation of digital data onto the output of the PLL. Accordingly, apparatus 500 illustrates the modulation of digital data D onto the FVCO signal by way of modulator 104. Digital scaling block 102 receives the digital data D and applies a digital scaling factor KD to the digital data to generate a modulation input signal 103. The modulation input signal 103 is representative of an amount to deviate an output frequency of the FVCO signal. As shown in FIG. 1, modulator 104 is coupled to apply the modulation input signal 103 at two points within PLL 508. First, N-divider 112 divides the modulation input signal 103 and applies the divided input signal to accumulator 118. Second, feedforward modulation filter 114 applies a step response calibration factor KFF to accumulator 126 to adjust a feedforward gain of the feedforward path of PLL 508. Thus, the frequency of the output signal (i.e., FVCO) of PLL 508 is varied in response to the modulation input signal 103.

As shown in FIG. 5, the modulation input signal 103 is further provided to the variable sampling rate clock 532, where a frequency of the reference clock signal 534 is varied in response thereto. Thus, in the illustrated example, the sample rate of digital filter 224 is data dependent (i.e., dependent on the digital data D being modulated onto the output of the PLL 508). In one example, variable sampling rate clock 532 is configured to detect a transition of the digital data between a first logic state (i.e., a logic "0") and a second logic state (i.e., a logic "1"), and to vary the frequency of the reference clock signal 534 in response to detecting the transition. The variable sampling rate clock 532 may be further configured to increase the frequency of the reference clock signal 534 in response to detecting the transition and to decrease the frequency in response to detecting an absence of the transition. Thus, the sampling rate of the digital filter 224 is increased when there are more transitions in the digital data and decreased when there are fewer transitions in the digital data. Decreasing the sampling rate of the digital filter 224 may save on the power consumed by PLL 508.

Figure 6:
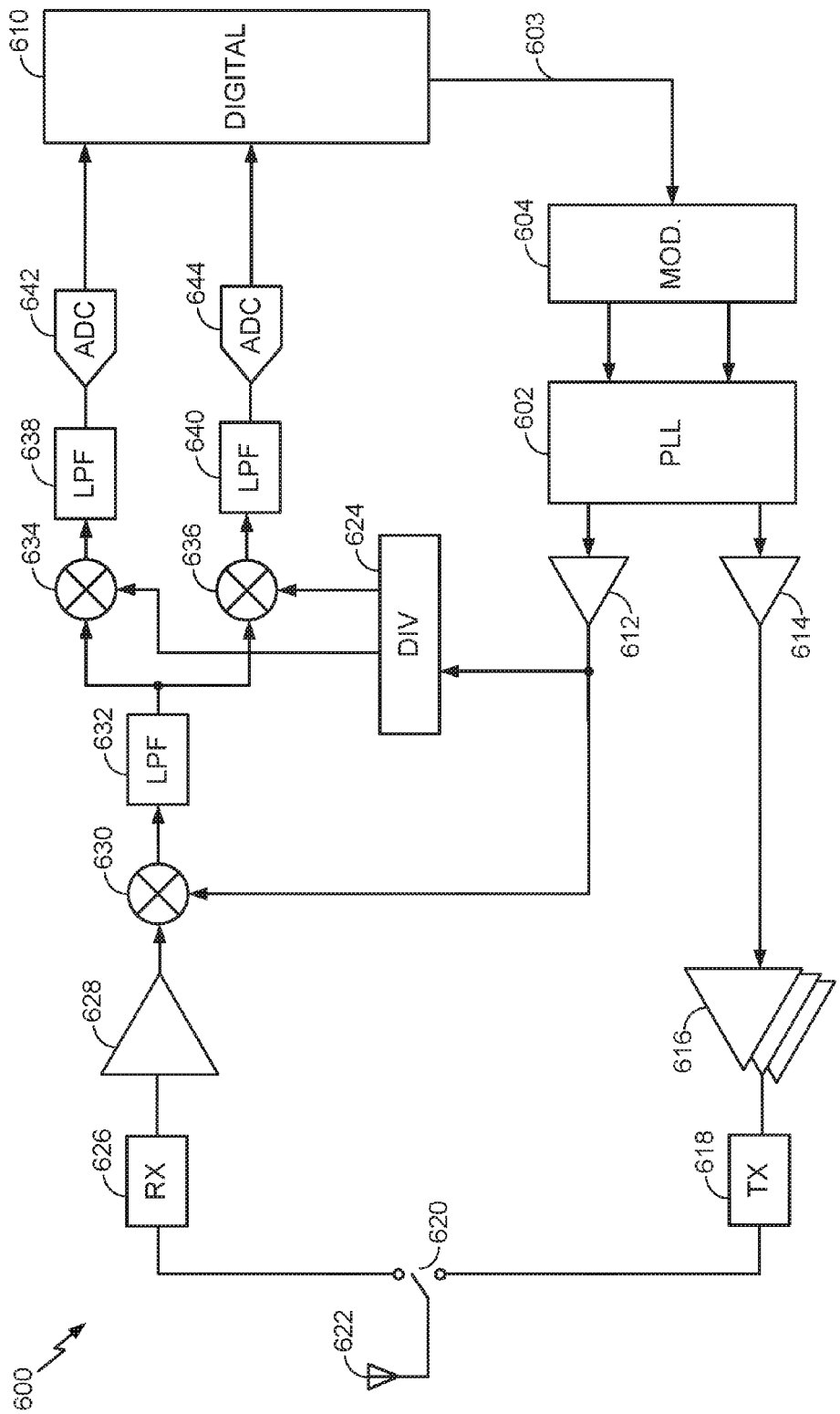
FIG. 6 illustrates an example wireless transceiver implemented with a PLL, according to aspects of the disclosure.

FIG. 6 illustrates an example wireless transceiver 600 implemented with a PLL 602, according to aspects of the disclosure. The illustrated example of wireless transceiver 600 includes PLL 602, a modulator 604, a digital controller 610, buffers 612 and 614, transmit amplifiers 616, a transmit matching network 618, a transmit/receive switch 620, an antenna 622, a divider 624, a receive matching network 626, a front end amplifier 628, a mixer 630, a low pass filter 632, mixers 634 and 636, low pass filters 638 and 640, and analog-to-digital converters 642 and 644.

The wireless transceiver 600 is illustrated as having distinct transmit and receive processing paths. Although FIG. 6 illustrates the transmit and receive processing paths as sharing the same PLL 602, other implementations of wireless transceivers may implement and utilize a separate PLL for each transmit and receive path.

The antenna 622 can be shared by both the transmit and receive processing paths. The antenna 622 couples received wireless signals to transmit/receive switch 620 (also referred to as a duplexer) that can be configured to couple the receive signals from the antenna 622 to the remainder of the receive operating path while isolating the receive path from transmit signals. The receive output from the transmit/receive switch 620 is coupled to receive matching network 626 which is coupled to front end amplifier 628, which can be, for example, a low noise amplifier (LNA). The front end amplifier 628 typically operates to substantially govern the total receiver noise figure, and thus, is typically implemented as an LNA having 10-20 dB of gain. The output from the front end amplifier 628 is coupled to mixer 630 which is coupled to a low pass filter 632.

The low pass filter 632 operates to perform RF selection by eliminating or otherwise attenuating signals outsider a desired receive RF operating band. The low pass filter 632 can, for example, contribute to adjacent channel rejection. The output from the low pass filter 632 can be coupled to an RF input of a frequency converter, here depicted as mixers 634 and 636. The second inputs to the mixers 634 and 636 are driven by divider 624, which is driven by a local oscillator signal that is generated by PLL 602. The PLL 602 may be substantially or wholly implemented within wireless transceiver 600.

The output from the mixers 638 and 640 can be baseband signals that are coupled to respective ADCs 642 and 644 that operate to generate a digital representation of the respective baseband signals. The digital baseband signals are coupled to be received at an input of the digital controller 610. In one example, the digital controller 610 is a baseband processor configured to further process the received digital baseband signals.

The PLL 602 may be configured to operate in conjunction with a frequency reference (e.g., FREQ signal of FIG. 1) to generate one or more oscillator signals. The one or more oscillator signals can be used as a local oscillator for the receive frequency translation operation via receive buffer 612 and/or for transmit operations via transmit buffer 614. As shown in FIG. 6, an oscillator signal output from the PLL 602 can be coupled to an input of mixer 630 as well as to an input of divider 624.

The receiver embodiment illustrated in FIG. 6 implements a direct conversion technique in which the receive RF signal is converted to baseband in a single frequency conversion stage. Of course, the receiver in the wireless transceiver 600 is not limited to any particular configuration and may utilize direct conversion, super heterodyne, or some other configuration.

As shown in FIG. 6, the wireless transceiver 600 also includes a complementary transmitter. The digital controller 610 is configured to generate an input signal 603 representing data for transmission. The modulator 604 can be configured to directly modulate the digital data onto the output signal of PLL 602. PLL 602 may be implemented by way of any of the aforementioned PLLs including ADPLL 208 of FIG. 2.

The output from the transmit buffer 614 can be coupled to a transmit amplifier 616 that may alternatively be referred to as a power amplifier (PA). The transmit amplifier 616 can have a variable gain or a variable gain stage and can be configured to amplify the modulated oscillator signal to a desired transmit power level. The output from the transmit amplifier 616 is coupled to a transmit input of the transmit/receive switch 620 where it is coupled to the antenna 622.

Figure 7:
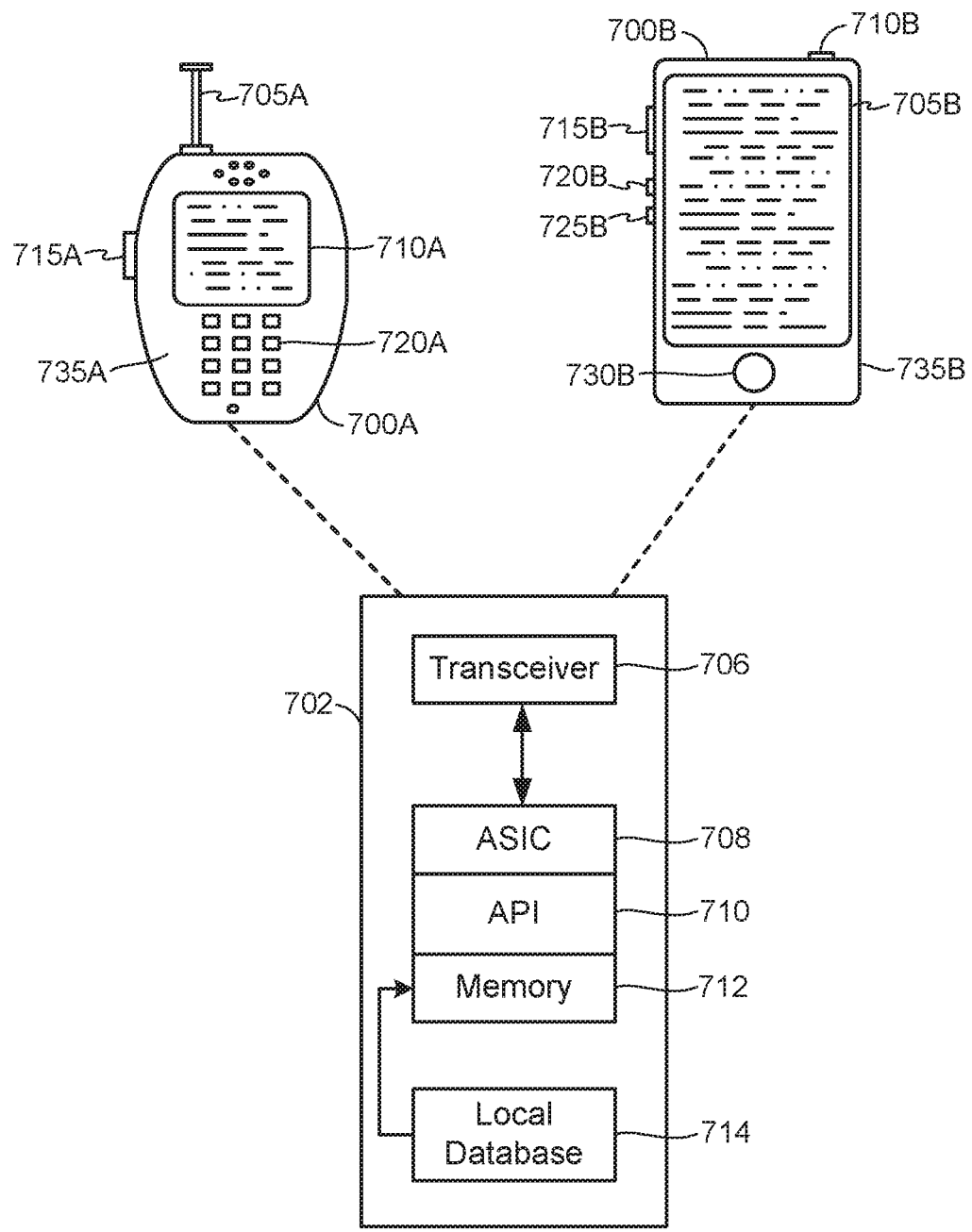
FIG. 7 illustrates example wireless devices, according to aspects of the disclosure.

FIG. 7 illustrates example wireless devices 700A and 700B, according to aspects of the disclosure. In some examples, wireless devices 700A and 700B may herein be referred to as wireless mobile stations. The example wireless device 700A is illustrated in FIG. 7 as a calling telephone and wireless device 700B is illustrated as a touchscreen device (e.g., a smart phone, a tablet computer, etc.). As shown in FIG. 7, an exterior housing 735A of wireless device 700A is configured with an antenna 705A, a display 710A, at least one button 715A (e.g., a PTT button, a power button, a volume control button, etc.) and a keypad 720A among other components, not shown in FIG. 7 for clarity. An exterior housing 735B of wireless device 700B is configured with a touchscreen display 705B, peripheral buttons 710B, 715B, 720B and 725B (e.g., a power control button, a volume or vibrate control button, an airplane mode toggle button, etc.), at least one front-panel button 730B (e.g., a Home button, etc.), among other components, not shown in FIG. 7 for clarity. For example, while not shown explicitly as part of wireless device 700B, the wireless device 700B may include one or more external antennas and/or one or more integrated antennas that are built into the exterior housing 735B of wireless device 700B, including but not limited to WiFi antennas, cellular antennas, satellite position system (SPS) antennas (e.g., global positioning system (GPS) antennas), and so on.

While internal components of wireless devices such as the wireless devices 700A and 700B can be embodied with different hardware configurations, a basic high-level configuration for internal hardware components is shown as platform 702 in FIG. 7. The platform 702 can receive and execute software applications, data and/or commands transmitted from a radio access network (RAN) that may ultimately come from a core network, the Internet and/or other remote servers and networks (e.g., an application server, web URLs, etc.). The platform 702 can also independently execute locally stored applications without RAN interaction. The platform 702 can include a transceiver 706 operably coupled to an application specific integrated circuit (ASIC) 708, or other processor, microprocessor, logic circuit, or other data processing device. The ASIC 708 or other processor executes the application programming interface (API) 710 layer that interfaces with any resident programs in the memory 712 of the electronic device. The memory 712 can be comprised of read-only or random-access memory (RAM and ROM), EEPROM, flash cards, or any memory common to computer platforms. The platform 702 also can include a local database 714 that can store applications not actively used in memory 712, as well as other data. The local database 714 is typically a flash memory cell, but can be any secondary storage device as known in the art, such as magnetic media, EEPROM, optical media, tape, soft or hard disk, or the like.

In one aspect, wireless communications by wireless devices 700A and 700B may be enabled by transceiver 706 based on different technologies, such as CDMA, W-CDMA, time division multiple access (TDMA), frequency division multiple access (FDMA), Orthogonal Frequency Division Multiplexing (OFDM), GSM, 2G, 3G, 4G, LTE, or other protocols that may be used in a wireless communications network or a data communications network. Voice transmission and/or data can be transmitted to the electronic devices from a RAN using a variety of networks and configurations. Accordingly, the illustrations provided herein are not intended to limit the embodiments of the invention and are merely to aid in the description of aspects of embodiments of the invention.

Accordingly, aspects of the present disclosure can include a wireless device (e.g., wireless devices 700A, 700B, etc.) configured, and including the ability to perform the functions as described herein. For example, transceiver 706 may be implemented as wireless transceiver 600 of FIG. 6, including ADPLL 602 and modulator 604. As will be appreciated by those skilled in the art, the various logic elements can be embodied in discrete elements, software modules executed on a processor or any combination of software and hardware to achieve the functionality disclosed herein. For example, ASIC 708, memory 712, API 710 and local database 714 may all be used cooperatively to load, store and execute the various functions disclosed herein and thus the logic to perform these functions may be distributed over various elements. Alternatively, the functionality could be incorporated into one discrete component. Therefore, the features of the wireless devices 700A and 700B in FIG. 7 are to be considered merely illustrative and the invention is not limited to the illustrated features or arrangement.

Figure 8:
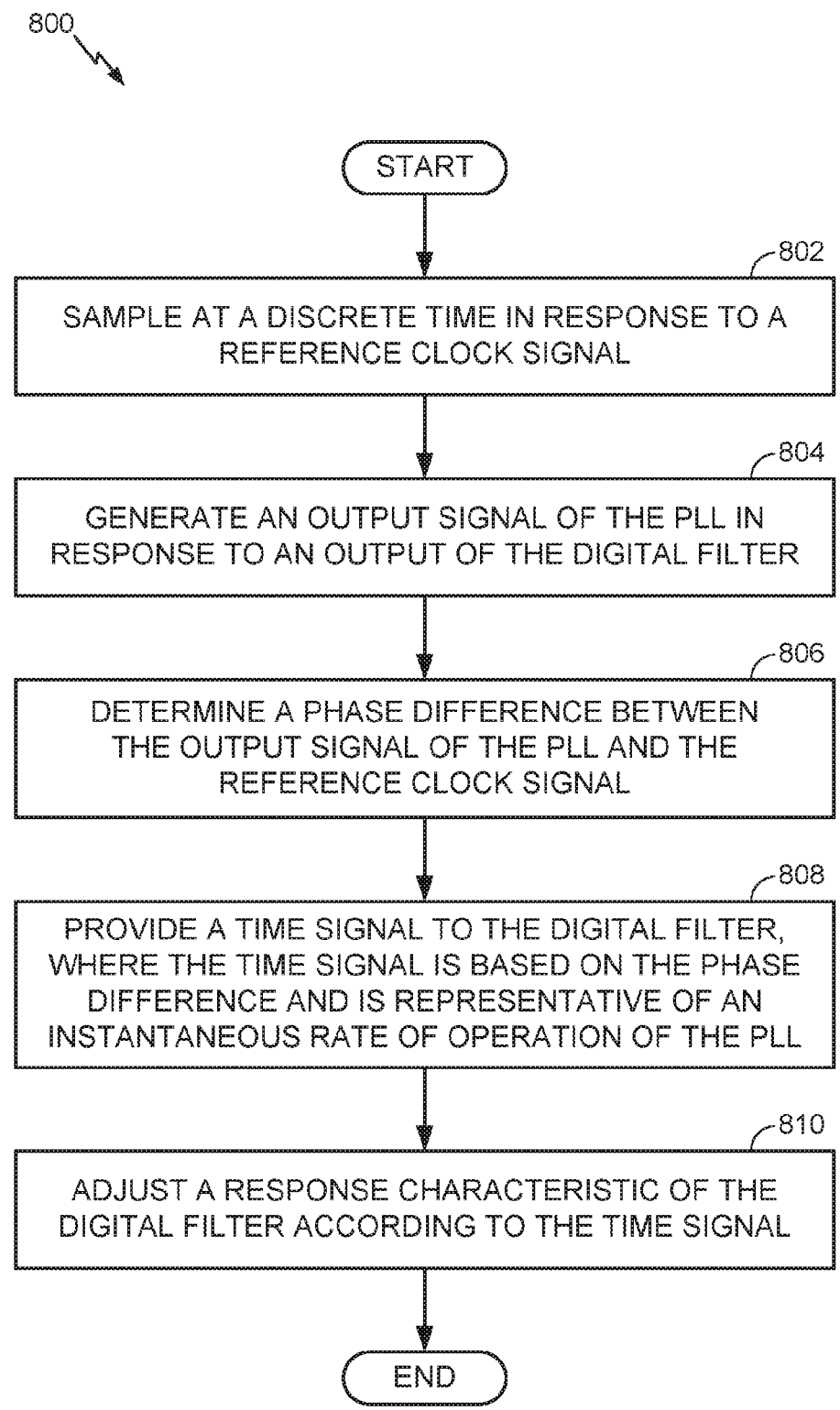
FIG. 8 illustrates an example process for use with a PLL, according to aspects of the disclosure.

FIG. 8 illustrates an example process 800 for use with a PLL, according to aspects of the disclosure. Process 800 will be described with reference to at least FIGS. 2 and 8. In a process block 802, digital filter 224 samples at a discrete time in response to reference clock signal 234. Next, in process block 804, the oscillator 128, generates an output signal (FVCO) of the PLL 208 in response to an output of digital filter 224. In a process block 806, the TDC 230 determines a phase difference between the output signal of the PLL 208 and the reference clock signal 234. Next, in a process block 808, the TDC 230 provides, by way of example differentiator 308, a time signal 236 to the digital filter 224. As mentioned above, the time signal 236 is based on the phase difference and is representative of an instantaneous rate of operation of the PLL 208. In process block 810, the digital filter 224 adjusts a response characteristic of the digital filter 224 (e.g., by way of modulator 412) according to the time signal 236.

Figure 9:
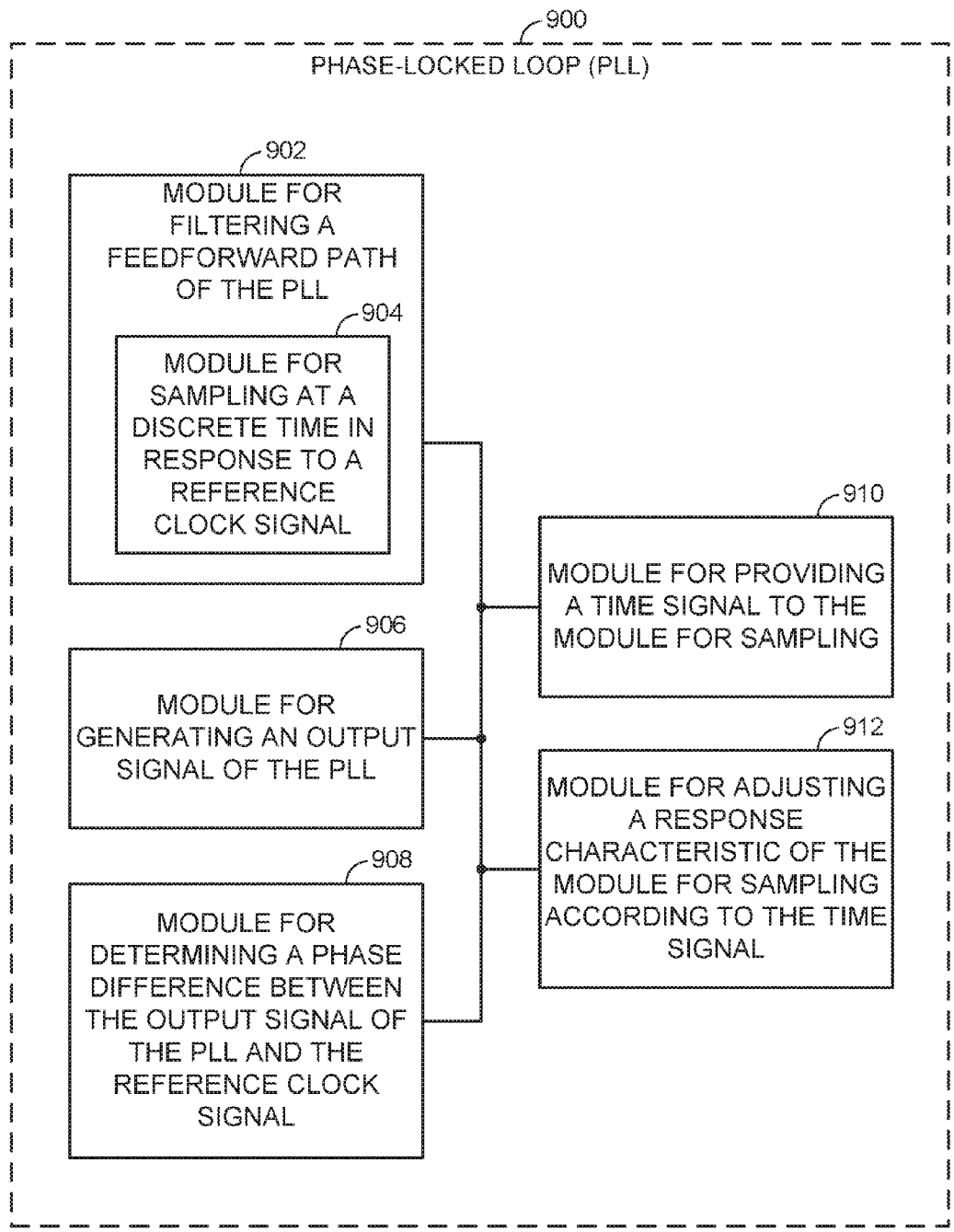
FIG. 9 illustrates sample aspects of components that may be employed in an apparatus configured to support the dynamic adjustment of a response characteristic of a PLL digital filter, according to aspects of the disclosure.

FIG. 9 illustrates sample aspects of components that may be employed in an apparatus configured to support the dynamic adjustment of a response characteristic of a PLL digital filter, according to aspects of the disclosure. PLL 900 is one possible implementation of PLL 208 of FIG. 2.

A module 902 for filtering a feedforward patch of the PLL 900 may correspond at least in some aspects to, for example, digital filter 224 of FIG. 2 and/or digital filter 400 of FIG. 4A. As shown in FIG. 9, module 902 may further include a module 904 for sampling at a discrete time in response to a reference clock signal. The module 904 may correspond at least in some aspects to, for example, digital filter 224 of FIG. 2 and/or digital filter 400 of FIG. 4A. A module 906 for generating an output signal of the PLL 900 may correspond at least in some aspects to, for example, oscillator 128 of FIG. 2. A module 908 for determining a phase difference between the output signal of the PLL and the reference clock signal may correspond at least in some aspects to, for example, TDC 230 of FIG. 2, TDC 300 of FIG. 3, and or differentiator 308 of FIG. 3. A module 910 for providing a time signal to the module for sampling may correspond at least in some aspects to, for example, TDC 230 of FIG. 2, TDC 300 of FIG. 3, and or differentiator 308 of FIG. 3. A module 912 for adjusting a response characteristic of the module for sampling according to the time signal may correspond at least in some aspects to, for example, digital filter 224 of FIG. 2, digital filter 400 of FIG. 4A, modulator 412 of FIG. 4A, and/or modulator 430 of FIG. 4B.

The functionality of the modules 902-912 may be implemented in various ways consistent with the teachings herein. In some designs, the functionality of modules 902-912 may be implemented as one or more electrical components. In some designs, the functionality of modules 902-912 may be implemented as a processing system including one or more processor components. In some designs, the functionality of modules 902-912 may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIG. 9, as well as other components and functions described herein, may be implemented using any suitable means. Such means also may be implemented, at least in part, using corresponding structure as taught herein. For example, the components described above in conjunction with the "module for" components of FIG. 9 also may correspond to similarly designated "means for" functionality. Thus, in some aspects, one or more of such means may be implemented using one or more of processor components, integrated circuits, or other suitable structure as taught herein.

Further, those of skill in the art will appreciate that the various illustrative logical blocks, modules, circuits, and algorithm steps described in connection with the embodiments disclosed herein may be implemented as electronic hardware or a combination of computer software and electronic hardware. To clearly illustrate this interchangeability of hardware and hardware-software combinations, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a non-transitory computer readable media embodying a method for the dynamic adjustment of a response characteristic of a phase-locked loop digital filter. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A phase-locked loop (PLL), comprising:
    a digital filter configured to sample at a discrete time that is responsive to a reference clock signal received at the digital filter, wherein the digital filter comprises a discrete-time state-space digital filter;
    an oscillator coupled to the digital filter and configured to generate an output signal of the PLL; and
    a time-to-digital converter (TDC) coupled to the oscillator to determine a phase difference between the output signal and the reference clock signal, and to provide a time signal to the digital filter, wherein the time signal is based on the phase difference and is representative of an instantaneous rate of operation of the PLL, and wherein the digital filter is further configured to adjust a response characteristic of the digital filter according to the time signal.

2. The PLL of claim 1, wherein the digital filter is configured to adjust the response characteristic of the digital filter to reduce one or more spurs in the output signal in response to the time signal.

3. The PLL of claim 1, wherein the response characteristic is a sampling rate of the digital filter.

4. The PLL of claim 3, wherein the digital filter comprises a time step modulator coupled to modulate a filter coefficient of the digital filter in response to the time signal.

5. The PLL of claim 1, wherein the PLL is configured to vary a frequency of the output signal in response to a modulation input signal, and wherein the PLL further comprises a variable sampling rate clock configured to vary a frequency of the reference clock signal in response to the modulation input signal.

6. The PLL of claim 5, wherein the modulation input signal comprises digital data representative of an amount to deviate the frequency of the output signal of the PLL, and wherein the variable sampling rate clock is further configured to detect a transition of the digital data between a first logic state and a second logic state, and to vary the frequency of the reference clock signal in response to detecting the transition.

7. The PLL of claim 6, wherein the variable sampling rate clock is further configured to increase a frequency of the variable sampling rate clock in response to detecting the transition of the digital data between the first logic state and the second logic state.

8. The PLL of claim 7, wherein the variable sampling rate clock is further configured to decrease the frequency of the variable sampling rate clock in response to detecting an absence of the transition.

9. The PLL of claim 1, wherein the PLL is implemented as an All-Digital Phase Locked Loop (ADPLL).

10. A method for use with a phase-locked loop (PLL) that comprises a digital filter, an oscillator, and a time-to-digital converter (TDC), the method comprising:
sampling, by the digital filter, at a discrete time in response to a reference clock signal received at the digital filter, wherein the digital filter comprises a discrete-time state-space filter;
generating, by the oscillator, an output signal of the PLL in response to an output of the digital filter;
determining, by the TDC, a phase difference between the output signal of the PLL and the reference clock signal;
providing, by the TDC, a time signal to the digital filter, wherein the time signal is based on the phase difference and is representative of an instantaneous rate of operation of the PLL; and
adjusting, by the digital filter, a response characteristic of the digital filter according to the time signal.

11. The method of claim 10, wherein the response characteristic is a sampling rate of the digital filter.

12. The method of claim 11, further comprising modulating, by the digital filter, a filter coefficient of the digital filter in response to the time signal.

13. The method of claim 10, further comprising:
receiving, at the TDC, a modulation input signal comprising digital data representative of an amount to deviate a frequency of the output signal of the PLL; and
varying a frequency the reference clock signal in response to the modulation input signal.

14. The method of claim 13, further comprising:
detecting a transition of the digital data between a first logic state and a second logic state; and
varying the frequency of the reference clock signal in response to detecting the transition.

15. The method of claim 14, further comprising:
increasing a frequency of the reference clock signal in response to detecting the transition of the digital data between the first logic state and the second logic state.

16. The method of claim 15, further comprising:
decreasing the frequency of the variable sampling rate clock in response to detecting an absence of the transition.

17. A phase-locked loop (PLL), comprising:
means for filtering in a feedforward path of the PLL, wherein the means for filtering includes means for sampling at a discrete time in response to a reference clock signal;
means for generating an output signal of the PLL in response to an output of the means for sampling;
means for determining a phase difference between the output signal of the PLL and the reference clock signal;
means for providing a time signal to the means for sampling, wherein the time signal is based on the phase difference and is representative of an instantaneous rate of operation of the PLL; and
means for adjusting a response characteristic of the means for sampling according to the time signal.

18. The PLL of claim 17, wherein the response characteristic is a sampling rate of the means for sampling.

19. The PLL of claim 18, further comprising:
means for modulating a filter coefficient of the digital filter in response to the time signal.

20. The PLL of claim 19, further comprising:
means for receiving a modulation input signal comprising digital data representative of an amount to deviate a frequency of the output signal of the PLL; and
means for varying a frequency of the reference clock signal in response to the modulation input signal.

21. The PLL of claim 20, further comprising:
means for detecting a transition of the digital data between a first logic state and a second logic state; and
means for varying the frequency of the reference clock signal in response to detecting the transition.

22. The PLL of claim 21, further comprising:
means for increasing a frequency of a variable sampling rate clock in response to detecting the transition of the digital data between the first logic state and the second logic state.

23. The PLL of claim 22, further comprising:
means for decreasing the frequency of the variable sampling rate clock in response to detecting an absence of the transition.

24. A non-transitory computer-readable medium including program code stored thereon for use with a phase-locked loop (PLL) that comprises a digital filter, an oscillator, and a time-to-digital converter (TDC), the program code comprising instructions to direct the PLL to:
sample, with the digital filter, at a discrete time in response to a reference clock signal received at the digital filter;
generate, with the oscillator, an output signal of the PLL in response to an output of the digital filter;
determine, with the TDC, a phase difference between the output signal of the PLL and the reference clock signal;
provide, by the TDC, a time signal to the digital filter, wherein the time signal is based on the phase difference and is representative of an instantaneous rate of operation of the PLL;
adjust, by the digital filter, a response characteristic of the digital filter according to the time signal, wherein the response characteristic is a sampling rate of the digital filter;
modulate, by the digital filter, a filter coefficient of the digital filter in response to the time signal.

25. The non-transitory computer-readable medium of claim 24, wherein the program code further comprises instructions to direct the PLL to:
receive, at the TDC, a modulation input signal comprising digital data representative of an amount to deviate a frequency of the output signal of the PLL; and
vary a frequency of the reference clock signal in response to the modulation input signal.

26. The non-transitory computer-readable medium of claim 25, wherein the program code further comprises instructions to direct the PLL to:
detect a transition of the digital data between a first logic state and a second logic state; and
vary the frequency of the reference clock signal in response to detecting the transition.

* * * * *